United States Patent

Nguyen et al.

[11] Patent Number: 6,122,566
[45] Date of Patent: Sep. 19, 2000

[54] METHOD AND APPARATUS FOR SEQUENCING WAFERS IN A MULTIPLE CHAMBER, SEMICONDUCTOR WAFER PROCESSING SYSTEM

[75] Inventors: Thu Nguyen; Michal Lavi, both of San Jose, Calif.

[73] Assignee: Applied Materials Inc., Santa Clara, Calif.

[21] Appl. No.: 09/033,822

[22] Filed: Mar. 3, 1998

[51] Int. Cl.$^7$ .................................................. G06F 7/00
[52] U.S. Cl. .......................... 700/218; 700/228; 438/908
[58] Field of Search .................................. 700/218, 228, 700/229, 214, 215; 438/908

[56] References Cited

U.S. PATENT DOCUMENTS

| | | | |
|---|---|---|---|
| 5,024,570 | 6/1991 | Kiriseko et al. | 414/222 |
| 5,105,362 | 4/1992 | Kotani | 364/468 |
| 5,864,485 | 1/1999 | Hawthorn et al. | 364/478.17 |
| 5,928,389 | 7/1999 | Jevtic | 29/25.01 |

FOREIGN PATENT DOCUMENTS

| | | | |
|---|---|---|---|
| 0 810 632 A2 | 12/1997 | European Pat. Off. | H01L 21/00 |
| 0 837 494 A3 | 12/1998 | European Pat. Off. | H01L 21/00 |
| 2 296 818 | 7/1996 | United Kingdom | H01L 21/00 |

*Primary Examiner*—Christopher P. Ellis
*Assistant Examiner*—Khoi H. Tran
*Attorney, Agent, or Firm*—Thomason Moser Patterson

[57] ABSTRACT

A method and apparatus for controlling a multiple chamber semiconductor wafer processing system. The processing system includes a plurality of process chambers about the periphery of the transfer chamber. A centrally located wafer transfer mechanism effects moving wafers between the process chambers. The process sequencer control is a real time, multi-tasking control program having a presequencer or look ahead feature for preventing delays in the processing. In one implementation, the look ahead feature identifies mid-sequence or oriented wafers which cannot be further processed because their destination chamber is busy. Rather than expend system resources waiting for the destination chamber to become available, the wafers are transferred to a holding position, preferably the load lock, and rescheduled at the earliest time to finish their processing.

21 Claims, 12 Drawing Sheets

FIG. 3

WAFER ORDER LIST — 210

| ID | INFORMATION |
|----|-------------|
| 1 | - WAFER LOT NUMBER<br>- WAFER ID<br>- WAFER MANAGEMENT POINTER<br>- FLAGS (PRE-ORIENTED, DEAD-LOCK)<br>- GROUP CHAMBER MASK<br>........ |
| 2 | SAME AS ABOVE |

FIG. 4

WAFER MOVE QUEUE — 212

| ID | INFORMATION |
|----|-------------|
| 1 | - WAFER ORDER LIST POINTER<br>- SOURCE CHAMBER/SLOT<br>- DESTINATION CHAMBER/SLOT<br>. . . . |
| 2 | SAME AS ABOVE |

FIG. 5

CHAMBER DATA STRUCTURE — 214

| ID | INFORMATION |
|----|-------------|
| 1 | - CHAMBER ID<br>- BUSY FLAG<br>- RECIPE REMAINING TIME<br>- WAFER COUNT USED FOR CLEANING CHECKING<br>...... |
| 2 | SAME AS ABOVE |

FIG. 6

WAFER MANAGEMENT DATA STRUCTURE — 216

| ID | INFORMATION |
|----|-------------|
| 1 | - WAFER LOT NUMBER<br>- WAFER NUMBER<br>- PROGRAM SEQUENCE ID<br>- WAFER STATUS<br>- SOURCE CASSETTE<br>- SOURCE SLOT<br>. |
| 2 | SAME AS ABOVE |

METHOD AND APPARATUS FOR SEQUENCING WAFERS IN A MULTIPLE CHAMBER, SEMICONDUCTOR WAFER PROCESSING SYSTEM

BACKGROUND OF THE DISCLOSURE

1. Field of the Invention

The present invention relates to an integrated circuit wafer processing system, and more particularly, to a multiple chamber semiconductor wafer processing system having multiple process chambers.

2. Description of the Background Art

A multiple chamber semiconductor wafer processing system (known as a cluster tool) that is capable of performing multiple processes sequentially and simultaneously on workpieces, such as semiconductor wafers, is shown in U.S. Pat. No. 4,951,601 issued to Maydan, et al. (Maydan I) and U.S. Pat. No. 5,292,393 also issued to Maydan, et al. (Maydan II), the disclosures of which are incorporated herein by reference.

The cluster tools described in Maydan I and Maydan II are basically an integrated vacuum processing system which includes one or more load lock chambers, a transfer chamber and a plurality of vacuum processing chambers communicating with the load lock and transfer chambers through selectively closeable slits in each chamber. Each of the processing chambers can be adapted to perform one or more integrated circuit processes such as chemical vapor deposition, physical vapor deposition, etch processes and rapid thermal annealing of one or more wafers positioned within the chamber. The load lock chamber incorporates an external wafer elevator which is adapted for positioning wafers adjacent a load lock chamber entrance and an internal elevator which is adapted for moving wafers to a position adjacent the load lock chamber exit or transfer position.

A centrally located wafer transfer mechanism is mounted within the transfer chamber and includes a generally horizontal wafer holding blade. The wafer transfer mechanism effects rotation, extension and retraction of the blade to selectively position the blade at the external elevator, internal elevator, and the processing chambers.

In a normal processing mode, a process controller transfers the wafers from slots in transport cassettes on the external elevator to holding plates of the internal elevator through an entrance in one of the load locks. After the cluster tool has been loaded with wafers, the entrance to the load lock is sealed. The load lock, the transfer chamber and the process chambers are then pumped down to a processing vacuum level. A real time automatic process sequencer is activated to move a first wafer to a process chamber, close its entrance and begin its processing, move a second wafer to a process chamber, close its entrance and begin its processing, and so on. A multiple chamber, continuous sequential process for multiple wafers is thereby provided by scheduling the routing of the wafers between the process chambers while the cluster tool is closed and under vacuum. When processing of a wafer is completed, it is normally returned to a particular plate on the internal elevator until processing of all wafers in a particular lot are completed and returned. The cluster tool is then opened to the atmosphere to unload the wafers to the transport cassettes on the external elevator.

The chemical process regulation and control of the elements of the multiple chamber processing system are provided by a real time multi-tasking control program which permits interactive user input and system supervision. In general, a sequencer task module reads a wafer order list which contains the identification and processing recipe, or sequence, for each wafer on the internal elevator holding plates and schedules the transfer of the wafers among the processing chambers and the process chemistries which occur therein.

Each wafer is processed in order from the wafer order list with one following the other when the process chambers in the wafer's recipe sequence become available. While this works well in theory, on some occasions, a wafer will become "deadlocked" in the processing sequence. This usually happens when the processing recipe for a particular wafer includes a short process step followed by a much longer process step. The shorter process step is scheduled and completed relatively rapidly, but when the transfer to the processing chamber for the longer process step is attempted, the wafer is blocked by the destination chamber being in a "busy" or processing mode for a similar-wafer ahead of it. When this happens, because of the length of the longer process, both chambers (source and destination) in actuality become "busy" or unavailable for further processing for the length of the longer process. The wafer in the source chamber is literally deadlocked waiting for the wafer's destination chamber to become available.

This also happens for inherently shorter processes such as the orientation process. The orientation process can be performed relative quickly, but then the wafer many times waits in the orientation chamber for the next process chamber in the process sequence to become available. This blocks use of the orientation chamber for other wafers which could be preoriented, and then processed regularly when the next process chamber in their process sequence becomes available. This preorientation would save significant time later in subsequent steps in their process sequences.

Therefore, a need exists in the art for a method and apparatus that reschedules system resources to reduce or avoid deadlocked situations.

SUMMARY OF THE INVENTION

The invention provides a multiple chamber processing system with a multi-tasking process control including a process sequencer which can look ahead in the process sequence and identify a deadlocked workpiece or wafer. Once identified, the deadlocked wafer is removed from the real time sequencing process by transferring the wafer to a holding position in the system, preferable by returning it to a load lock. In the load lock, the deadlocked wafer waits to be rescheduled into its original destination chamber when that resource becomes available.

The invention, therefore, provides a method and apparatus for unblocking the resources of a multiple chamber processing system (i;e., a cluster tool) by use of a presequencer to significantly increase system throughput. In one embodiment of the invention, the identified deadlocked wafer is a mid-sequence wafer that has finished one of its processing steps and is waiting in a source chamber to be transferred for its next processing step to a destination chamber. Rather than encumber the system resources by holding the source chamber busy while the wafer waits for the destination chamber to become available, and possibly delay one or more other wafers, the deadlocked mid-sequence wafer is moved to a holding position, e.g., the wafer is moved to the internal elevator of the load lock. After the move, the source chamber becomes free to continue processing other wafers in the system. The invention then reschedules the wafer held in the holding position when the destination chamber becomes available.

In a second embodiment of the invention, the invention identifies an oriented wafer in the orientor chamber as a deadlocked wafer, i.e., the wafer can not be processed because the first processing chamber of its process recipe is busy (unavailable). The short time necessary for the orientation process as compared to most of the chemistry processes can cause the orientor chamber to become a major source of deadlocked wafers, slowing the overall throughput of the system. Another reason for the orientor chamber to be of concern is that most of the wafers must pass through the orientor chamber and this will cause delays if the chamber is not utilized more effectively. The invention solves this problem by identifying an oriented wafer in the orientor chamber with its next destination chamber being busy as deadlocked wafer and moving the oriented wafer back to the load lock or some other convenient wafer holding position. This allows the system to continue to use the orientor chamber more effectively and increases throughput.

In a third embodiment of the invention, if all of the processing chambers are busy, the invention will provide a preorientation process where the wafers in the load lock which are waiting to be processed are first oriented and then returned to a holding position, preferably their original places in the load lock. Therefore, no matter where in the normal process sequence the orientation process would have taken place for a particular wafer, it can be skipped to save processing time because the sequence has been modified to increase the efficiency of the system.

In an illustrated implementation of the invention, these methods are executed by a process control sequencer, e.g., a programmed general purpose computer, that controls the cluster tool including one or more load lock chambers, a transfer chamber, a buffer chamber, an orientor chamber, and a plurality of vacuum process chambers. Each of the process chambers is adapted to perform one or more integrated circuit processes (recipes) on the wafers. A wafer transfer mechanism located centrally in the transfer chamber is used to move wafers among the various chambers to facilitate a multiple stage processing sequence.

BRIEF DESCRIPTION OF THE DRAWINGS

These and other objects, aspects and features of the invention will be more clearly understood and better described when the following detailed description is read in conjunction with the attached drawings, wherein:

FIG. 3 is a tabular representation of the wafer order list data structure used by the process control program illustrated in FIG. 2;

FIG. 4 is a tabular representation of the wafer move queue data structure used by the process control program illustrated in FIG. 2;

FIG. 5 is a tabular representation of the chamber data structure used by the process control program illustrated in FIG. 2;

FIG. 6 is a tabular representation of the wafer management data structure used by the process control program illustrated in FIG. 2;

To facilitate understanding, identical reference numerals have been used, where possible, to designate identical elements that are common to the figures.

DETAILED DESCRIPTION

Figure 1:
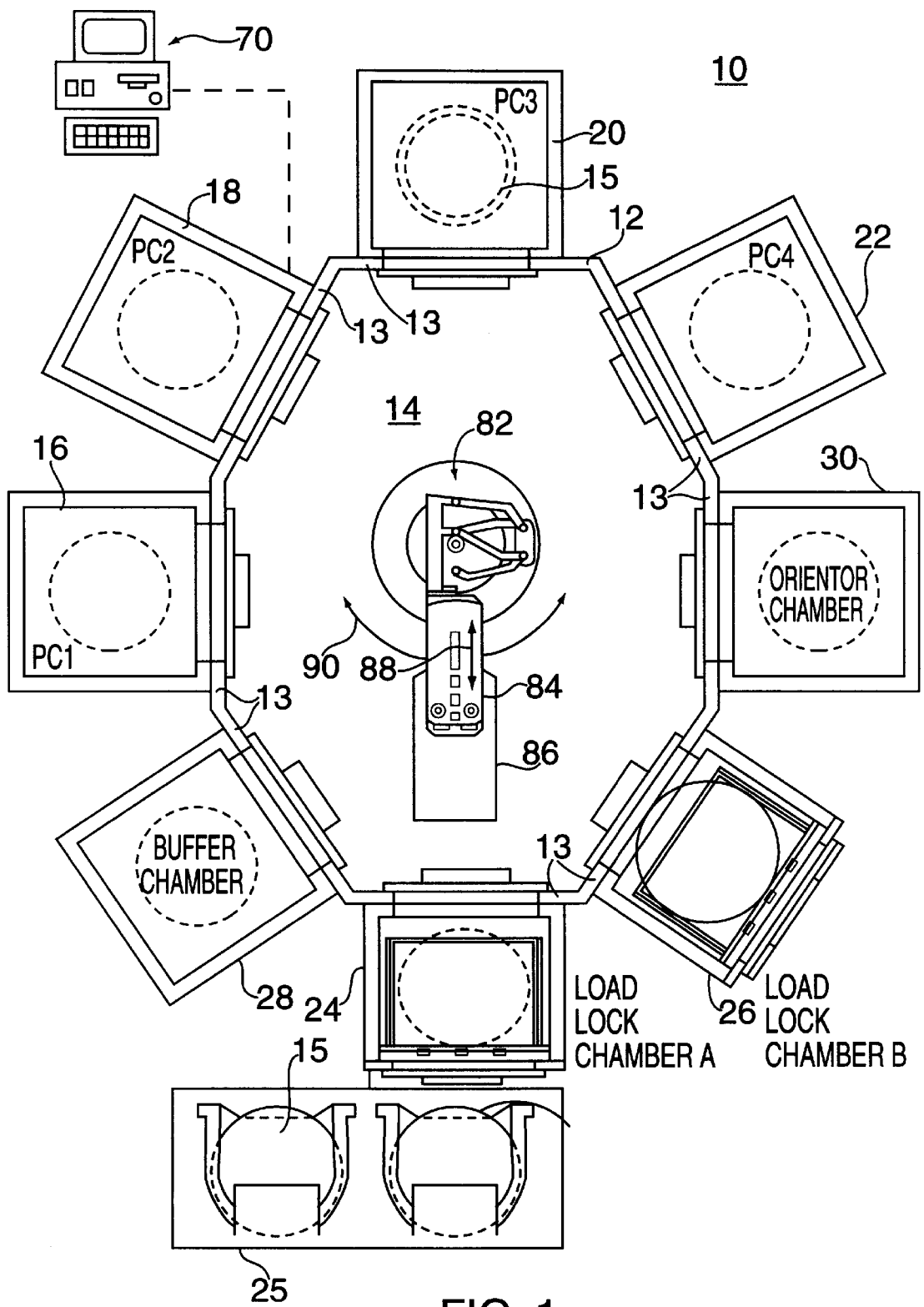
FIG. 1 is a schematic, top plan view of a multiple chamber processing system operated in accordance with the invention.

FIG. 1 is a top plan view of a preferred embodiment of a multiple chamber semiconductor wafer processing system 10 (a cluster tool) that operates in accordance with the present invention. The cluster tool is particularly adapted to vacuum process workpieces, such as silicon wafers, for integrated circuits of the very large scale integration (VLSI) type. The cluster tool 10 comprises an enclosed, generally octagonal main frame or housing 12 having eight sidewalls 13 that define an enclosed vacuum transfer enclosure or chamber 14.

The cluster tool 10 contains, for example, four process chambers (PC1–PC4) 16, 18, 20, 22, a transfer chamber 14, a buffer chamber 28, a wafer-orientor/degas chamber 30, and a pair of load lock chambers 24 and 26. Each process chamber represents a different stage or phase of semiconductor wafer processing. For the purposes of this disclosure, the buffer chamber 28 and wafer-orientor/degas chamber 30 are considered special types of process chambers. As such, the term "process chamber" or simply chamber is intended to encompass all forms of chambers within the cluster tool that are accessible by the transfer mechanism.

To effectuate wafer transfer amongst these chambers, the transfer chamber 14 contains a first robotic transfer mechanism 82, e.g., a single blade robot (SBR). The wafers 15 are typically carried from storage to the system in a plastic transport cassette 25 that is placed within one of the load lock chambers 24 or 26. The robotic transport mechanism 82 transports the wafers 15, one at a time, from the cassette 25 to the wafer orientor/degas chamber 30. The buffer chamber 28 is generally not used until after the wafer is processed within one or more of the process chambers 16, 18, 20, 22. Individual wafers are carried upon a wafer transport blade 86 that is located at the distal end 84 of the robotic mechanism 82. The mechanism, although shown in a contracted states, extends and contracts as represented by arrow 88 and rotates as represented by arrow 90. The transport operation is controlled by the controller 70.

The controller 70 controls the processing and wafer transfer performed by the cluster tool 10. The controller contains a microprocessor (CPU), a memory for storing the control routines, and support circuits such as power supplies, clock circuits, cache and the like. The controller 70 also contains input/output peripherals such as a keyboard, mouse, and display. The controller 70 is a general purpose computer that is programmed to perform the sequencing and scheduling operations that facilitate wafer processing and transport. The software routines that control the cluster tool are stored in memory and executed by the microprocessor to facilitate control of the cluster tool.

The controller 70 instructs the transport mechanism and positions the wafers in the process chambers 16, 18, 20, and 22 in accordance with a process schedule. To facilitate such wafer movement, the transfer chamber 14 is surrounded by, has access to, the four process chambers 16, 18, 20 and 22. Once processing is complete within a process chamber, the transport mechanism 82 moves the completed wafer from the process chamber and transports the wafer to the buffer chamber 28. The wafer is then removed form the buffer chamber and placed in the load lock chamber 24 or 26.

Figure 2:
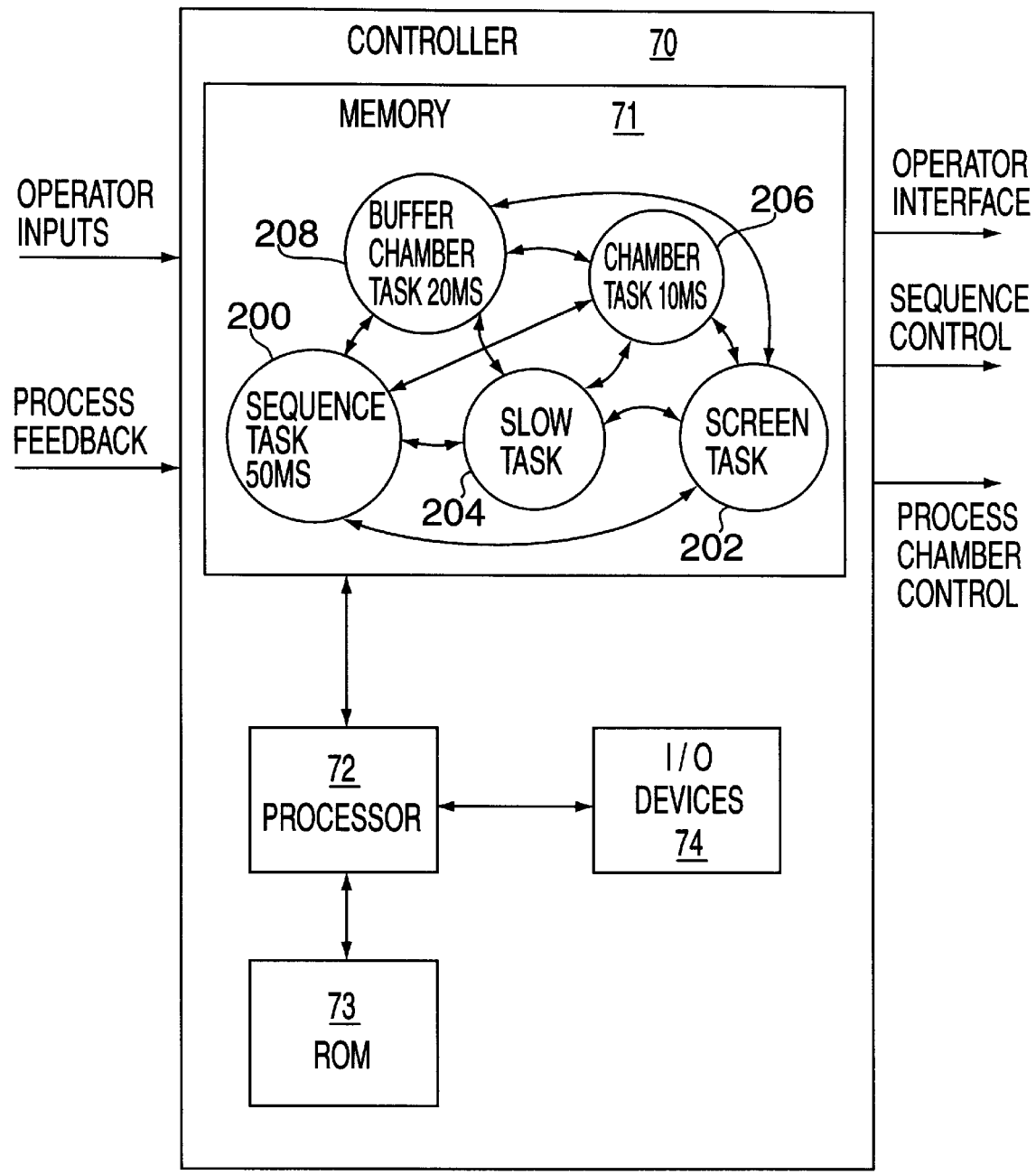
FIG. 2 is a pictorial system flow diagram of the process control program of the controller illustrated in FIG. 1.

FIG. 2 depicts a block diagram of the controller 70 that executes system process control software to produce the automatic control and process sequencing for the cluster tool 10. More specifically, the controller 70 can be implemented as a general purpose computer (e.g., a mainframe computer, a workstation, a personal computer or a micro-controller) for controlling a multiple chamber processing system. The general purpose computer may comprise a central processing unit (CPU) or processor 72, a memory 71, a ROM 73 and various input/output devices 74, e.g., a monitor, a keyboard and/or various storage devices.

In the preferred embodiment, the controller is a microcomputer and incorporates a novel system software application as described below. The system software is represented by one or more software applications or modules which are loaded into the memory 71 from an I/O device 74, e.g., a magnetic or an optical disk drive, diskette or tape. Alternatively, the system software can be implemented as firmware, e.g., stored within a read only memory (ROM) 73 and the like. As such, the cluster tool control software of the present invention can be stored on one or more computer readable media. Finally, once the software applications are loaded, the processor 72 executes the novel software in the memory to implement a cluster tool sequencer. Generally, the processor 72 may be one of any commercially available microprocessors, e.g., a model 680×0 manufactured by Motorola, Inc.

It is contemplated that some of the process steps discussed herein as software processes may be implemented within hardware, e.g., as circuitry that cooperates with the microprocessor to perform various process steps. Although he controller is depicted as a general purpose computer that is programmed to perform various scheduling routines, the processes that are implemented by the software can be implemented as hardware as an application specific integrated circuit (ASIC) or discrete circuit components. As such, the process steps described herein are intended to be broadly interpreted as being equivalently performed by software, hardware, or any combination thereof.

The sequencer software is multi-tasking and divided into real time task oriented modules which are called on an interrupt basis from timers which generate periodic call signals. The basic sequencer software as seen in FIG. 2 includes a sequencer task module 200, a screen task module 202, a slow task module 204, a chamber task module 206, and a buffer chamber task module 208. Each of the modules 200–208 when called, interrupt the processing of the slower modules, finish their processing and then return to the interrupted routine at the last exit point. This conventional multi-tasking hierarchical operation allows more critical operations to be processed on a real time basis without seriously affecting the processing of other tasks in the system. Each of the earlier described modules 200–208 can communicate with the any of the other modules by changing a data structure which the other modules utilize, by leaving a message or data for the other module on its exit, or by a issuing a command to another module during its processing which is thereafter executed during processing by the commanded module.

Generally, the sequencer task module 200 controls the sequencing or stepwise process of the wafer manufacturing including the process recipe programs and the cleaning recipe programs. The module 200 operates on a data structure, the wafer order list (WOL), which describes the wafers loaded in the load locks 24 and 26 and their process and cleaning recipes, i.e., the sequence and chemistries of the processes for different chambers. The process and cleaning recipes are each associated with a particular wafer of the WOL through another data structure, the wafer management data structure (WMDS), by a pointer to the information. The sequencer task module 200 operating on the information in the WOL and WMDS issues commands to the chamber task module to run the process steps of a particular process recipe or cleaning recipe for a particular chamber at the correct time. The wafers are moved through the different chambers by the sequencer task module 200 operating on a data structure, the wafer move queue (WMQ), which describes the transfer operations of the system to match the processing chemistries of the particular chambers. If there are any wafers on the WMQ, then the sequencer module commands the buffer task module 208 to perform the movement by control of the entrance slit valves of the chambers and the wafer transfer mechanism 82.

The chamber task module 206 handles the various recipes for integrated circuit processes on a wafer and for the cleaning recipes for a chamber including the actual control of the vacuum valves, process ionization of different chemicals, activating the RF power supplies and the like. The chamber task module 206 monitors and controls the processes occurring in the specialized and process chambers by the its operation on a data structure, the chamber data structure (CDS).

The screen task module 202 permits an operator to program certain data into the data structures of other modules, leave messages and commands in an interactive manner to the task modules (or other program objects) before they are executed and during their execution. One of the main parts of the screen task module 202 is an interactive text editor, permitting an operator to input and edit data and commands through an operator interface or display and store them to the control and management modules (not shown) for the processes. The screen task module 202 also allows the operator to display various status, alarm and monitoring information during the execution of the automatic control sequence of the system 10.

A slow task module 204 is also provided to monitor and time certain tasks for the system which are relatively slow to take place. For example, the cleaning time for a chamber may be monitored by determining the amount of time the RF coils of a particular chamber have been energized or active.

The data structures used by the process control will now be more fully detailed with respect to FIGS. 3–6. The WOL data structure is more fully disclosed in FIG. 3. The wafer order list comprises a plurality of information blocks 1, 2, . . . n, each describing one of the wafers which are presently scheduled to be processed by the wafer processing system 10. Each information block, for example block 1 labeled 210, includes a wafer identification number uniquely identifying the wafer and the lot number to which it belongs. The information block 210 further includes a pointer to the WMDS (FIG. 6) which controls the processing of the wafer and has wafer management blocks 1, 2, . . . n corresponding to the information blocks 210 of the wafer order list. Following these fields are two flag fields: one for identifying the wafer as a deadlocked process wafer and the other for identifying it as a deadlocked oriented (preoriented) wafer. The last field in the information block 210 is a group chamber mask which identifies a group of process chambers in which the wafer may be scheduled for processing. The remaining information blocks 2, 3 . . . n of the WOL, are similarly constructed as information block 210 and contain information about the remaining wafers to be processed in the cluster tool.

The wafer management data structure is more fully disclosed in FIG. 6 and is similar in structure to the wafer order list. The WMDS has wafer management blocks 1, 2, . . . n, each corresponding to a respective WOL information block and consequently to a particular wafer. The fields of the wafer management blocks, for example block 1 labeled 216, contain the lot number of the wafer and the wafer identification number. In addition, a status field describes the process status. Further, there is a program sequence identification which describes the process recipe for a wafer and the cleaning recipe associated therewith. The last field in the wafer management block 216 records the source cassette number and slot where the wafer starts its process. Ideally, such source slot will be the slot the wafer is returned to after processing. The remaining wafer management blocks 2, 3 . . . n of the WMDS are similarly constructed as wafer management block 216 and contain similar information about the remaining wafers in the system 10.

The WMQ data structure is more fully disclosed in FIG. 4. The wafer move queue is a list of wafers which need movement and consists of a number of identifier blocks 1, 2, . . . n, which contain fields identifying the wafer to be moved and its movement path (source and destination). Identifier block 1 labeled 212 has fields including one for storing a pointer to the wafer information block in the wafer order list identifying the wafer to be moved and another two fields for identifying the source and destination process chambers, or if the source or destination is a cassette or the load lock, the slot in the elevator or cassette. The remaining identifier blocks 2, 3 . . . n of the WMQ data structure, are similarly constructed as identifier block 212 and contain similar data for any other wafers which need to be moved.

The chamber data structure is more fully disclosed in FIG. 5. The chamber data structure is a list of the process chambers and their status. The chamber data structure consists of a number of status blocks 1, 2, . . . n, where status block 1 labeled 214 has fields for identifying the chamber by a unique number and the time remaining in a recipe step being run by the chamber. Another field is used as a flag to indicate whether the chamber is busy or free and indicates, when set, the chamber is busy running a process recipe step or a cleaning recipe step. The last field is used to store a wafer count which is the number of wafers processed by the particular chamber since its last cleaning. The remaining status blocks 2, 3 . . . n of the process chamber data structure, are similarly constructed as status block 214 and contain similar data regarding the other chambers in the system.

Figure 7:
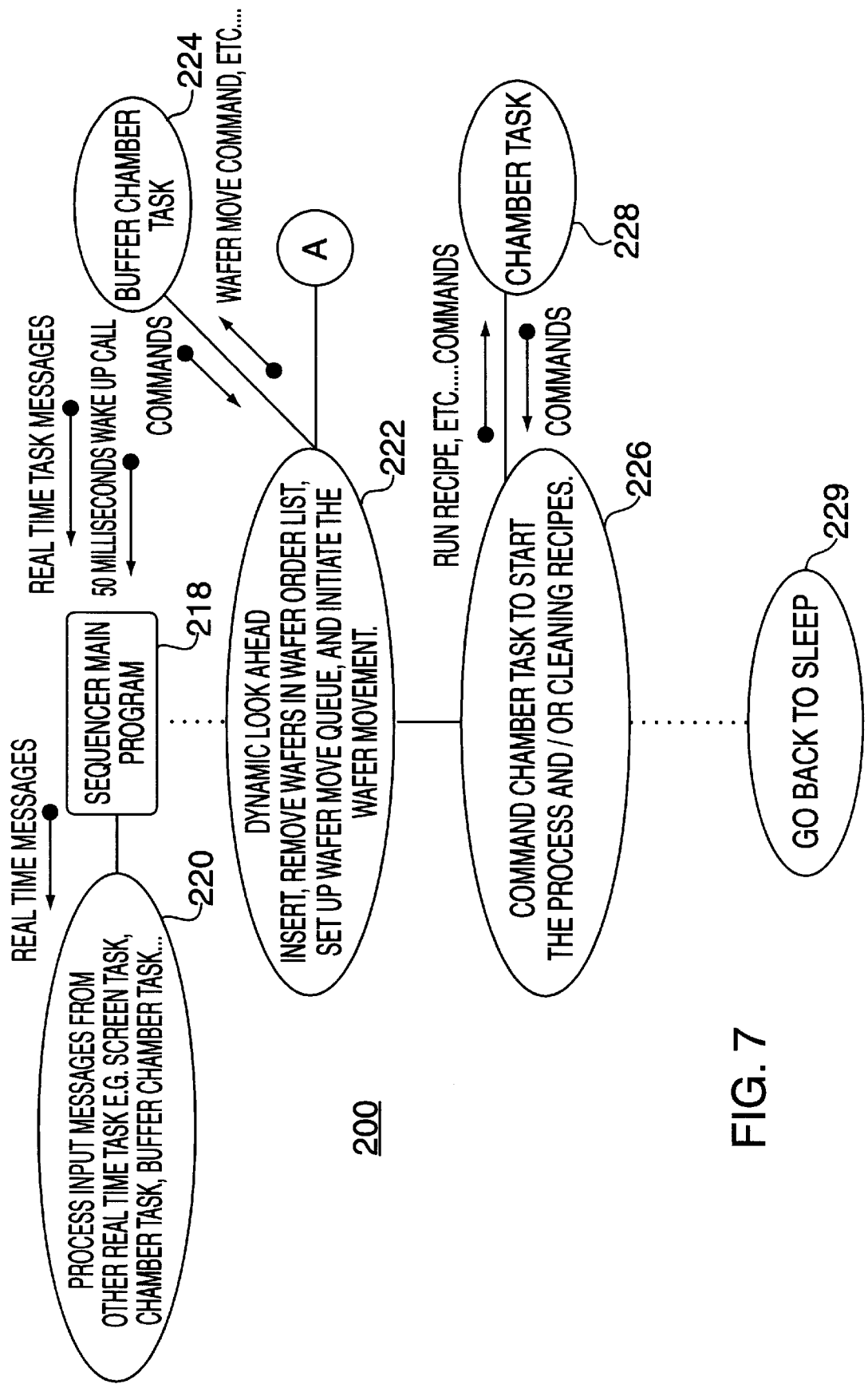
FIG. 7 is a detailed flow diagram of the sequencer task module of the process control program illustrated in FIG. 2.

With respect now to FIG. 7, the sequencer task module 200 including a presequencer constructed in accordance with the invention will now be more fully explained. The sequencer task module main program 218 is a list of routines which are run every 50 ms. In general, the task module 200 initiates in block 220 by processing any input messages, data or commands from the other routines to update any information that may be needed from the other routines to perform the next task.

At block 222, the module 200 runs a dynamic look ahead routine or presequencer which looks ahead to schedule and prioritize wafer movement among the above described process chambers 16–30 to reduce or eliminate bottlenecks, mainly wafer deadlocks. This presequencing allows the system 10 to more effectively utilize the chambers and increase throughput of the cluster tool.

The dynamic look ahead program 222 views the wafer order list which is used by the sequencer task module 200 to order the sequence of the processing and determines which wafers in the sequence may cause problems in throughput in the future. From the list of identified problem wafers in the sequence, the program reorders the wafer identification data in the wafer order list and wafer move queue to alleviate or eliminate these problems. The wafer movements to reduce these problems are prioritized by which type of wafer transfer will improve throughput the most and any corrections necessary are taken before further processing.

Because the presequencer routine 222 is executed every 50 ms., once a problem is identified it is almost instantaneously corrected.

After the WMQ and WOL or other necessary information is updated, the sequencer task module 200 issues commands to the buffer chamber task module as represented by block 224 to move wafers in a predetermined sequence as defined by the WMQ and, once the wafers are moved to their appropriate chambers, a command is issued to the chamber task module in block 226 to sequence either the process recipe for a wafer or the cleaning recipe for a particular chamber. As such, a chamber task us initiated at block 228. Once the chamber task is begun, the task sequencer module 200 goes to sleep at block 229 and awaits the next wake up call.

A more detailed functional flow diagram of the dynamic look ahead routine 222 is disclosed in FIGS. 8a–8g. The general functions of the presequencer program as represented by block 222 are detailed in FIG. 8a, where the first function in block 230 is to look ahead in the wafer order list for any mid-sequence deadlock wafers. These are wafers that have finished one part of their processing and are ready to move on to the next process chamber but find the next processing chamber busy. They, however, are also holding up the system by not releasing the processing chamber or resource in which they are presently located. This creates a possible deadlock where substantial parts of the possible processing time for this and other wafers stops until the destination chamber for that wafer becomes ready (available) to receive the deadlock wafer. The resolution of the problem is to remove the deadlocked wafer from its source process chamber and return it to a holding position in the system 10, preferably the load lock chamber, until the that wafer's destination chamber becomes available. This allows other wafers to be processed in the released source chamber while the deadlock wafer is waiting for the destination chamber. The load lock is an illustrative holding position. The deadlocked wafer could be temporarily placed in an unused process chamber, or a special holding position chamber could be used. The holding position chamber may contain a wafer elevator to store a plurality of deadlocked wafers that are awaiting process chambers.

The next function in block 232 is to look ahead in the wafer order list for any deadlocked oriented wafers in the orientor chamber 39. These are wafers which have finished orientation and are ready to move on to the next processing chamber, but find that the next processing chamber is busy. They, however, are also holding up the cluster tool by not releasing the orientor containing the deadlocked oriented wafer to process other wafers. This creates a possible deadlock where much of the possible processing of this and other wafers stops until the destination chamber becomes ready to receive the oriented wafer. The resolution of the problem is again to remove the deadlocked wafer from the orientor chamber 30 and return it to a holding position in the system 10, preferably the load lock until the destination chamber is free. This allows other wafers to be oriented in the released orientor chamber while the deadlocked oriented wafer is waiting to move to the destination chamber. The next two functions in the blocks 234 and 236 are similar. They look ahead through the WOL for the returned process wafers and returned oriented wafers in a holding position or the load lock and reschedule them for further processing.

Once the identification and rescheduling of the problem wafers (those subject to being deadlocked) has been accomplished, the movements of the wafer transfer mechanism 82 to (a) return the deadlocked wafers to the load lock, (b) to move other wafers into the released process chamber or orientor chamber, and (c) to move other scheduled wafers, including the rescheduled load lock wafers, can be prioritized by testing for the type of wafer in block 238. The wafer types include deadlocked wafers, oriented wafers, mid-sequence wafers, and the like. The testing reveals which types of wafers are listed in wafer move queue and the wafer identification data is then reorganized based on the type of wafers that are to be moved. For example, a deadlocked mid-sequence wafer would have higher priority than an oriented, but unprocessed wafer. Furthermore, the oriented, but unprocessed wafer would have a higher priority than an unoriented wafer that has yet to be removed from the load lock. After the wafer move queue has been prioritized, the wafers in the queue are moved to their respective destinations as shown in block 240.

Figure 8A:
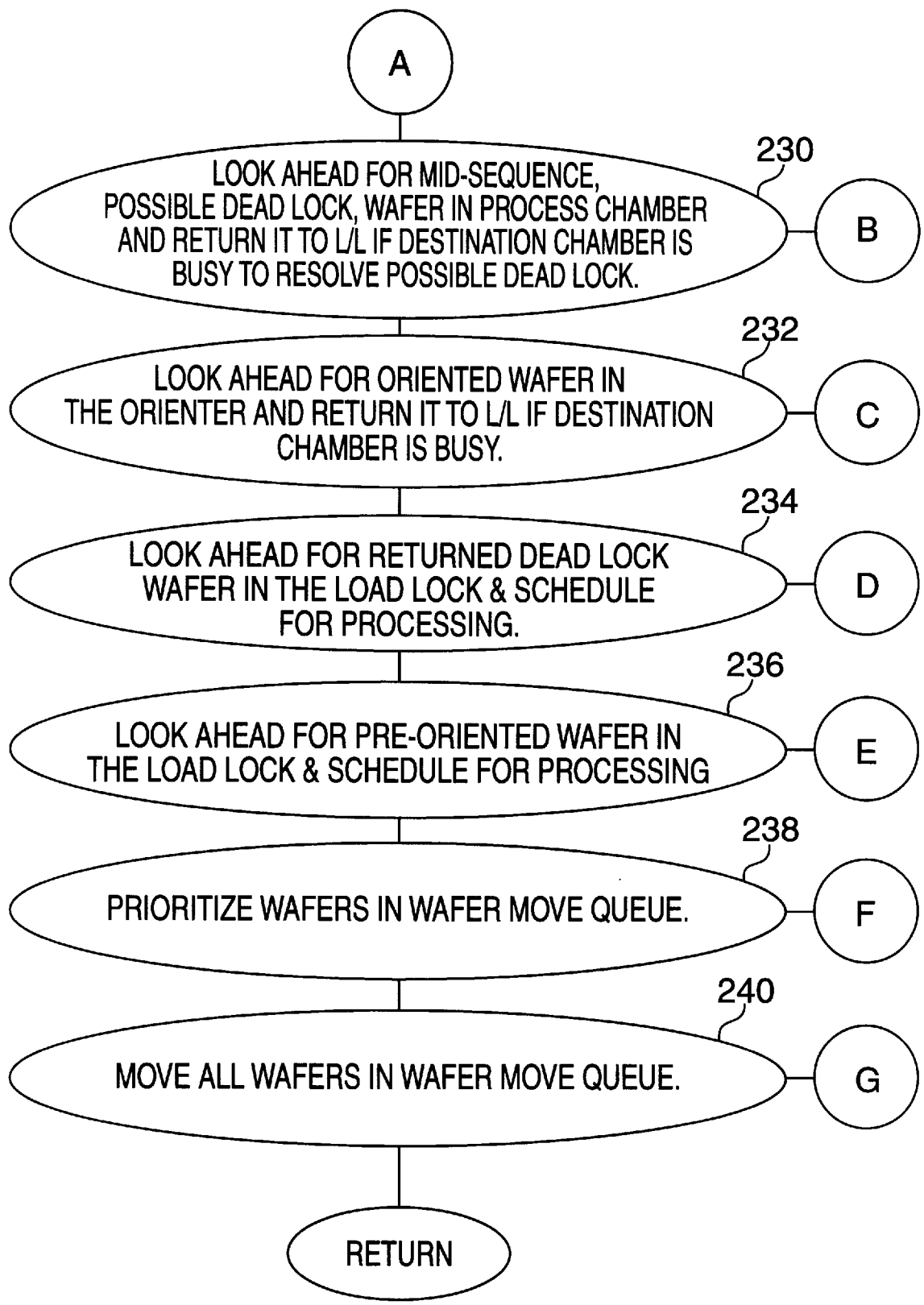
FIGS. 8a–8g are a detailed flow diagram of the look ahead feature of the sequencer task module illustrated in FIG. 7.
Figure 8B:
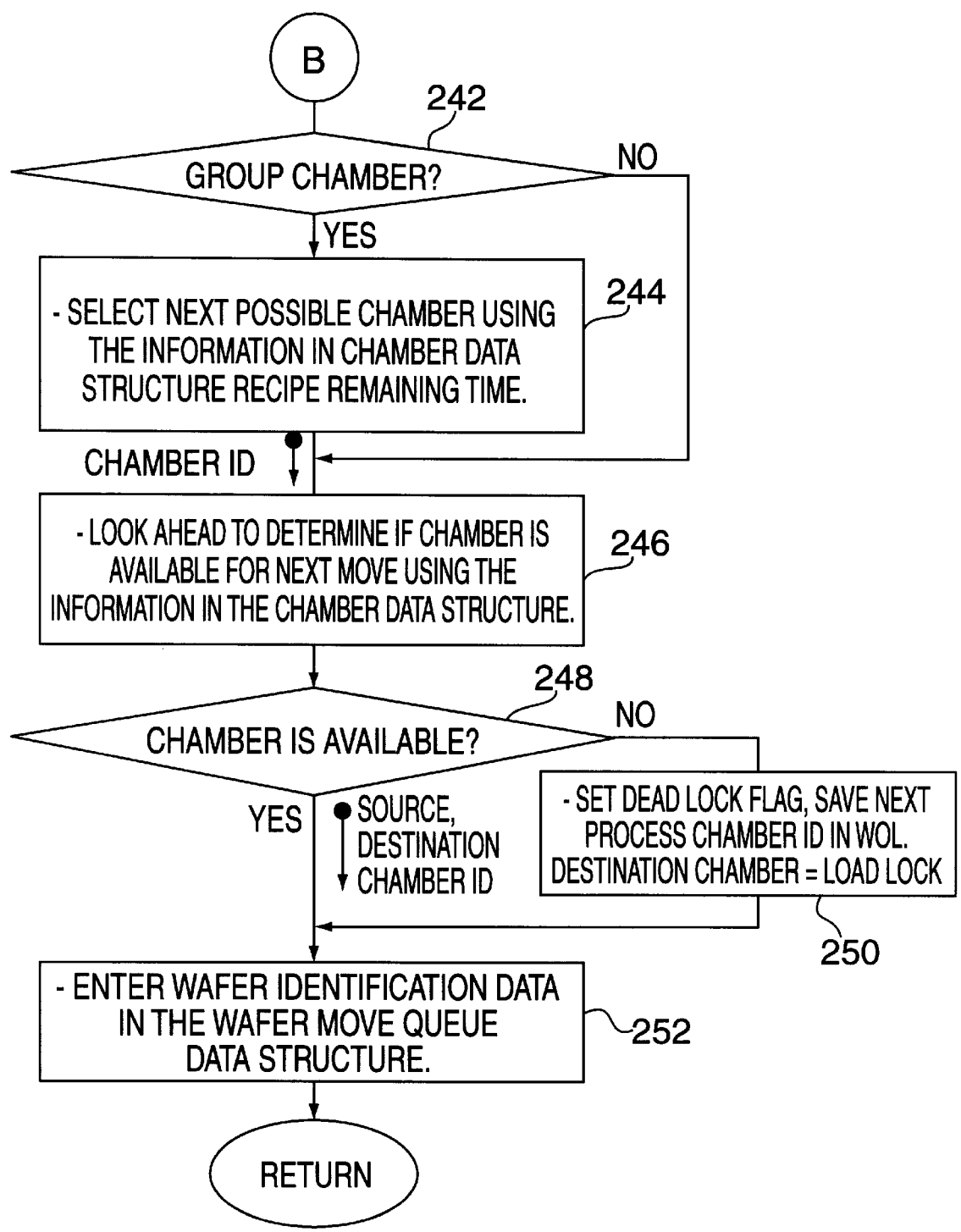

The detailed routine implementing block 230 in FIG. 8a for a dynamic look ahead for identification of a deadlocked mid-sequence wafer will now be more fully explained with respect to FIG. 8b. All wafers on the wafer order list are examined by the routine in FIG. 8b before it returns to the main routine, but for the purposes of clarity, the steps for only one wafer will be described. The routine in block 242 initially reads the chamber identification of the chamber that presently contains the wafer (source chamber) and determines whether it is a group chamber, i.e., whether there are a number of destination chambers which may receive the wafer for the next step. If the chamber is not a group chamber, then the routine uses that particular chamber ID number found and proceeds to block 246. If the chamber identification indicates that the wafer is contained within a group chamber, then by looking through the chamber data structure of each chamber of the group, the next available chamber of the group is chosen by reading the recipe remaining time in block 244. The program continues within block 246 with the source chamber identification and destination chamber identification to determine if the destination chamber will be available for the next move. The availability of the destination chamber is tested through the busy status flag and the time remaining in recipe field of the chamber data structure.

If the chamber is available, then the wafer identification data is entered into the wafer move queue data structure in block 252 and the program returns if this is the last wafer order list entry to be examined. If the chamber is not available, then in block 250 the deadlock flag for that particular wafer is set and the identification of its next process chamber, which is now busy, is saved in the wafer order list. The destination chamber field for the wafer is then changed to be the load lock and the wafer identification data entered into the wafer move queue in block 252. As such, upon execution of the buffer chamber task module, the wafer will be moved to the load lock. If all wafers in the WOL have been tested, the routine thereafter returns to the main task module.

Figure 8C:
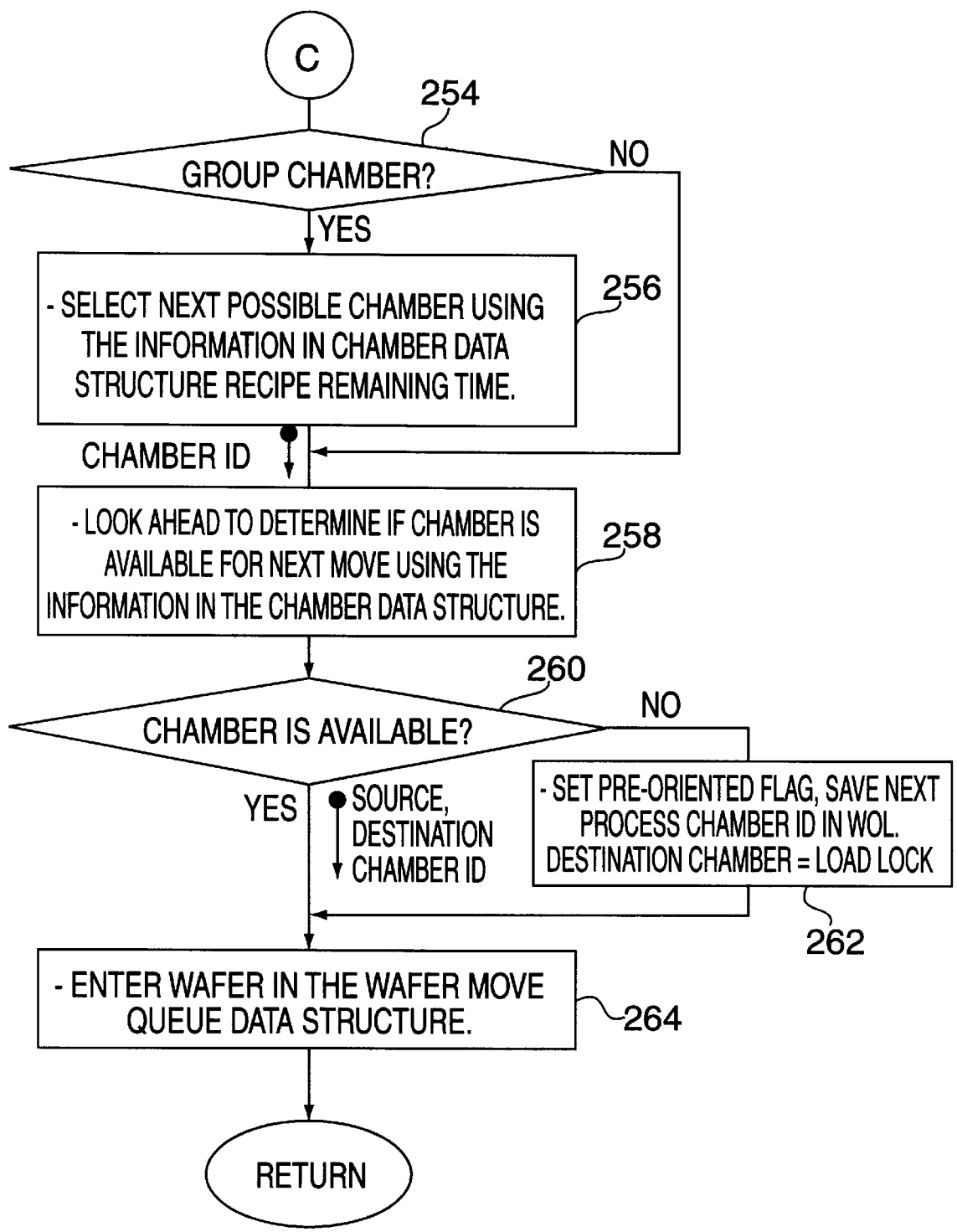

The detailed routine implementing block 232 in FIG. 8a for a dynamic look ahead for identification of a deadlocked oriented wafer will now be more fully explained with respect to FIG. 8c. All wafers on the wafer order list are examined by the routine in FIG. 8c before it returns to the main routine, but for the purposes of clarity, the steps for only one wafer will be described. The routine, in block 254, initially reads the chamber identification of the chamber that presently contains the wafer (source chamber) and determines whether it is a group chamber, i.e., whether there are a number of destination chambers which may receive the wafer for the next step. If the chamber is not a group chamber, then the routine uses that particular chamber ID number found and proceeds to block 258. If the chamber identification indicates that the wafer is contained within a group chamber, then by looking through the chamber data structure of each chamber of the group, the next available chamber of the group is chosen by reading the recipe remaining time in block 256. The program continues within block 258 with the source chamber identification and destination chamber identification to determine if the destination chamber will be available for the next scheduled move. The availability of the destination chamber is tested through the busy status flag and the recipe remaining time field of the chamber data structure.

If the next chamber is available as tested in block 260, then the wafer identification data is entered into the wafer move queue data structure in block 264 and the program returns if this is the last wafer order list entry to be examined. If the chamber is not available, then in block 262 the preoriented flag for that particular wafer is set and the identification of its next process chamber, which is now busy, is saved in the wafer order list. The destination chamber field for the wafer is then changed to be the load lock and the wafer identification data entered into the wafer move queue in block 264. As such, upon execution of the buffer chamber task module, the wafer will be moved to the load lock. If all wafers in the WOL have been tested, the routine thereafter returns to block 232 of FIG. 8a.

Figure 8D:
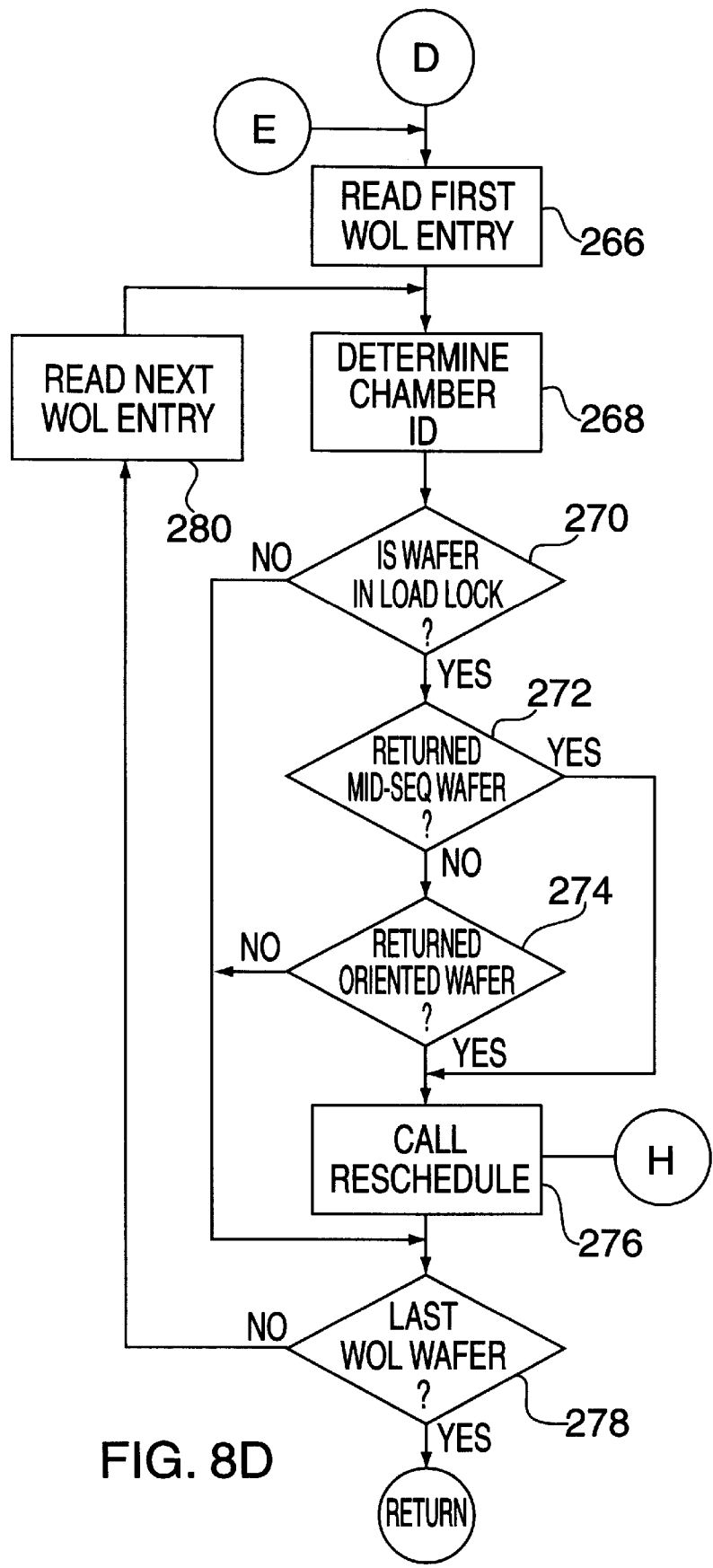

After processing for mid-sequence wafers and for oriented wafers, the routine will transfer to FIG. 8d where it will check the wafer order list for the returned process wafers and returned oriented wafers and attempt to reschedule them into the original destination chambers. The routine of FIG. 8d thus implements the method steps represented by blocks 234 and 236 of FIG. 8a. The routine will perform the group of steps 266–278 for the all wafers in the wafer order list and begins in block 266 by testing whether the presently addressed information block in the wafer order list identifies the first wafer. Next, in block 268, the routine determines the identification of the chamber in which the presently addressed wafer is located. The chamber ID is then tested in block 270 to determine if it is the load lock chamber. If it is not, then the program moves to the next wafer by transferring to the test in the block 278. However, if the wafer is in the load lock, then it may be a returned wafer. The mid-sequence flag is tested in block 272 and the oriented flag tested in block 274 to determine whether either is set. If either flag is set, then this is a returned wafer waiting to be rescheduled. The process then transfers to FIG. 8e which implements a rescheduling routine called by block 276. If the test in blocks 272, 274 indicates that the deadlock flags are not set, then the program returns to blocks 278, 280 where the next information block in the wafer order list is examined. After all wafers in the wafer order list have been examined, then the program returns to block 234 or 236 of FIG. 8a.

Figure 8E:
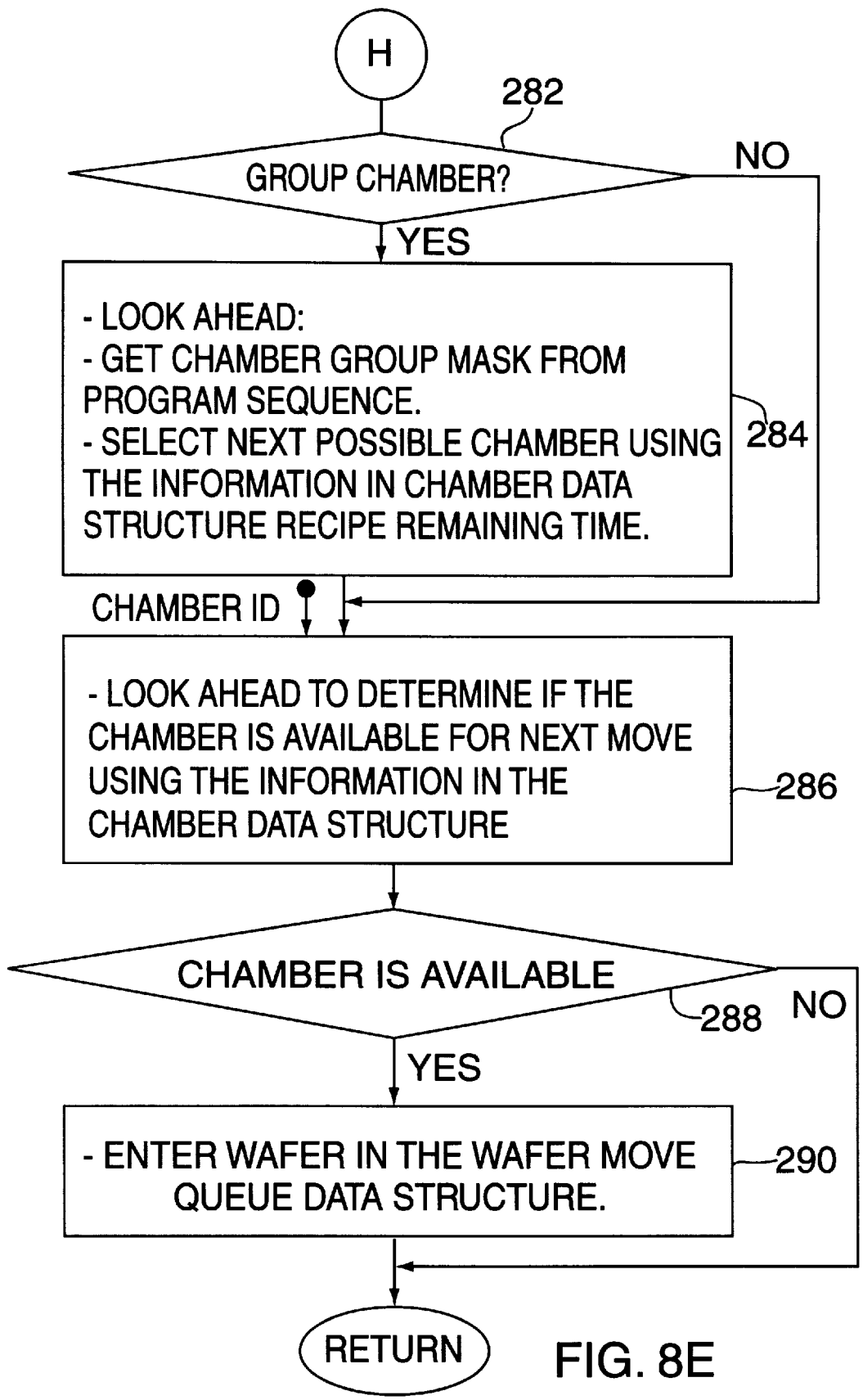
Figure 8F:
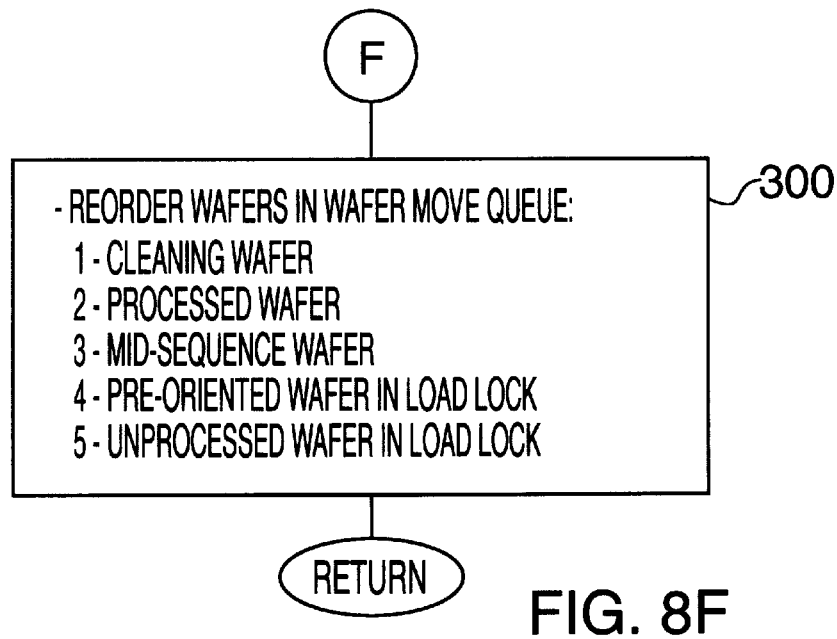

FIG. 8e depicts a flow diagram of a routine that implements a wafer rescheduling process for block 276 of FIG. 8d. The routine, in block 282, initially reads the chamber identification of the chamber that presently contains the wafer (source chamber) and determines whether it is a group chamber, i.e., whether there are a number of destination chambers which may receive the wafer for the next step. The identity of the group chambers is contained in a group mask. If the chamber is not a group chamber (i.e., not in a group mask), then the routine uses that particular chamber ID number found and proceeds to block 286. If the chamber identification indicates that the wafer is contained within a group (i.e., the chamber is in the group mask), then, in block 284, by looking through the chamber group mask and the chamber data structure of each chamber of the group, the next available chamber of the group is chosen by reading the recipe remaining time. At block 286, the routine inspects the chamber data structure to determines if the destination chamber (target) is available. The routine queries, in block 288, if the target chamber is available. If the query is negatively answered, the routine returns to block 276 of FIG. 8*d*. Consequently, the wafer is not rescheduled and it must wait longer. If the query of block 288 is affirmatively answered, the routine enters block 290 and updates the WMQ data structure. As such, upon the next buffer chamber task execution, the wafer will be moved from the holding position in the load lock into a chamber for processing. The routine then returns to block 276 of FIG. 8*e*.

After identifying and scheduling the moves for the deadlocked mid-sequence process wafers, the deadlocked oriented wafers, and identifying and rescheduling the moves for the returned mid-sequence wafers and the preoriented wafers, the program will prioritize the wafer move queue. A detailed functional flow diagram of the steps of this process is more fully detailed in FIG. 8*f* which implements block 238 of FIG. 8*a*. The wafer move queue is loaded in a random order from the different programs that need to move wafers including the process and cleaning recipes, the presequencer, the screen task module (operator controlled), and the like. The routine in FIG. 8*f* reorders these moves to prioritize and unblock possible bottle necks in the process. The wafer order list is reordered to prioritize the cleaning wafers first, the processed wafers second, the deadlocked mid-sequence and oriented wafers third, the returned mid-sequence and oriented wafers in the load lock fourth, and the unprocessed wafers in the load lock fifth. In this manner, the process chambers that need cleaning are not halted so that that chamber will become available in the shortest possible time. Further, completed process wafers which are done and can be moved out of the system or to the next step and thereby release resources for other wafers to be moved in the second priority. The deadlocked mid-sequence or oriented wafers are moved as a third priority to free up the particular process chamber or the orientor chamber, respectively. The returned oriented wafers and the returned mid-sequence wafers are then moved next to take advantage of any scheduling breaks that there may be and to finish the processing on these wafers. Lastly, an unprocessed wafer in the load lock is the last to be put on the move queue. Thereby a new wafer does not create new scheduling issues until the other partially processed wafers are attended to. In this manner, a minimum movement of the wafers is contemplated and efficient through processing increased significantly.

Figure 8G:
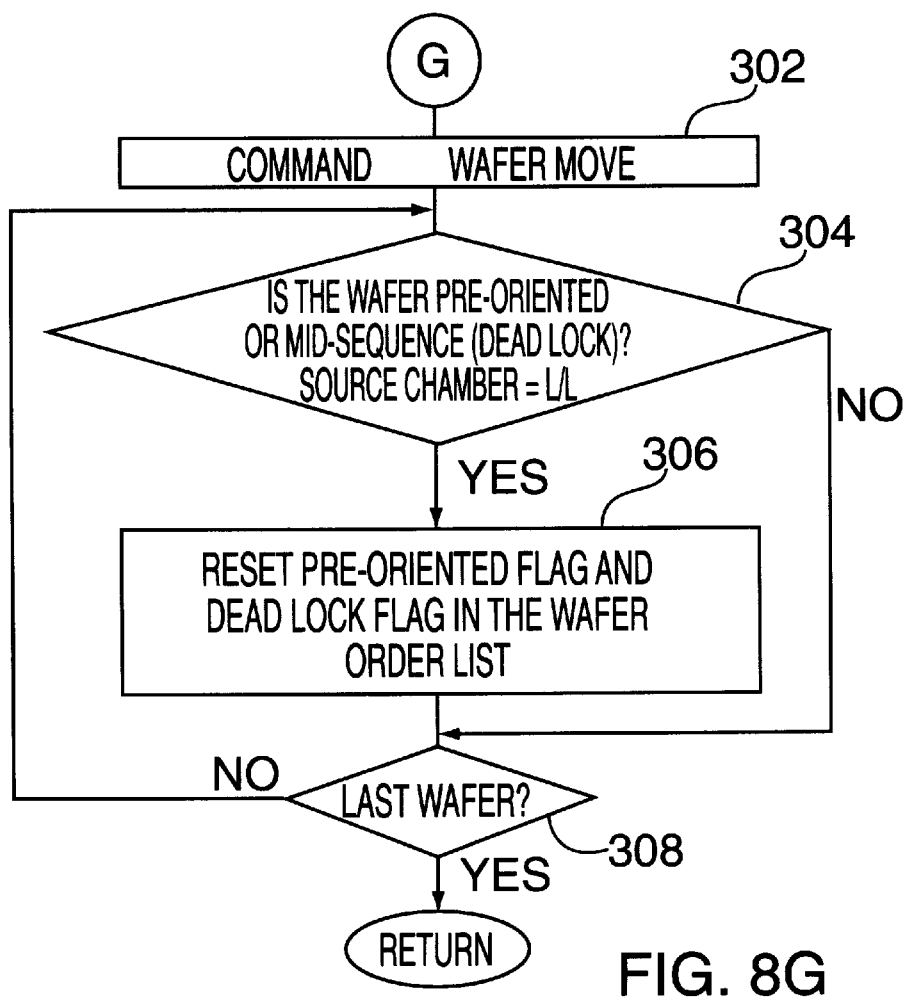

The program in FIG. 8*g* actually generates the commands to the buffer chamber task module to move the wafers and, as such, implements block 240 of FIG. 8*a*. After the WMQ has been reordered, the movement of the wafers on the list is initiated. Each entry in the wafer move queue is addressed sequentially in block 302, and a command is given to the buffer task module to move the particular wafer under present interest. After the wafer move command has been given for a wafer on the list, the routine determines in block 304 whether that wafer is a returned mid-sequence or oriented wafer by examining the flags in the wafer order list for wafer identification data and whether the source chamber for the wafer is the load lock. If both conditions are met, then the preoriented flag or the deadlock flag is reset in the wafer order list in block 306 depending upon which type wafer it is determined to be (i.e., whether the wafer was deadlocked or preoriented). After clearing these flags, the program determines whether this is the last wafer in the wafer move queue in block 308. If not the last wafer, the program returns to block 302 to issue another wafer move command. After the last wafer command has been issued, the program returns to block 240 of FIG. 8*a*.

Figure 9A:
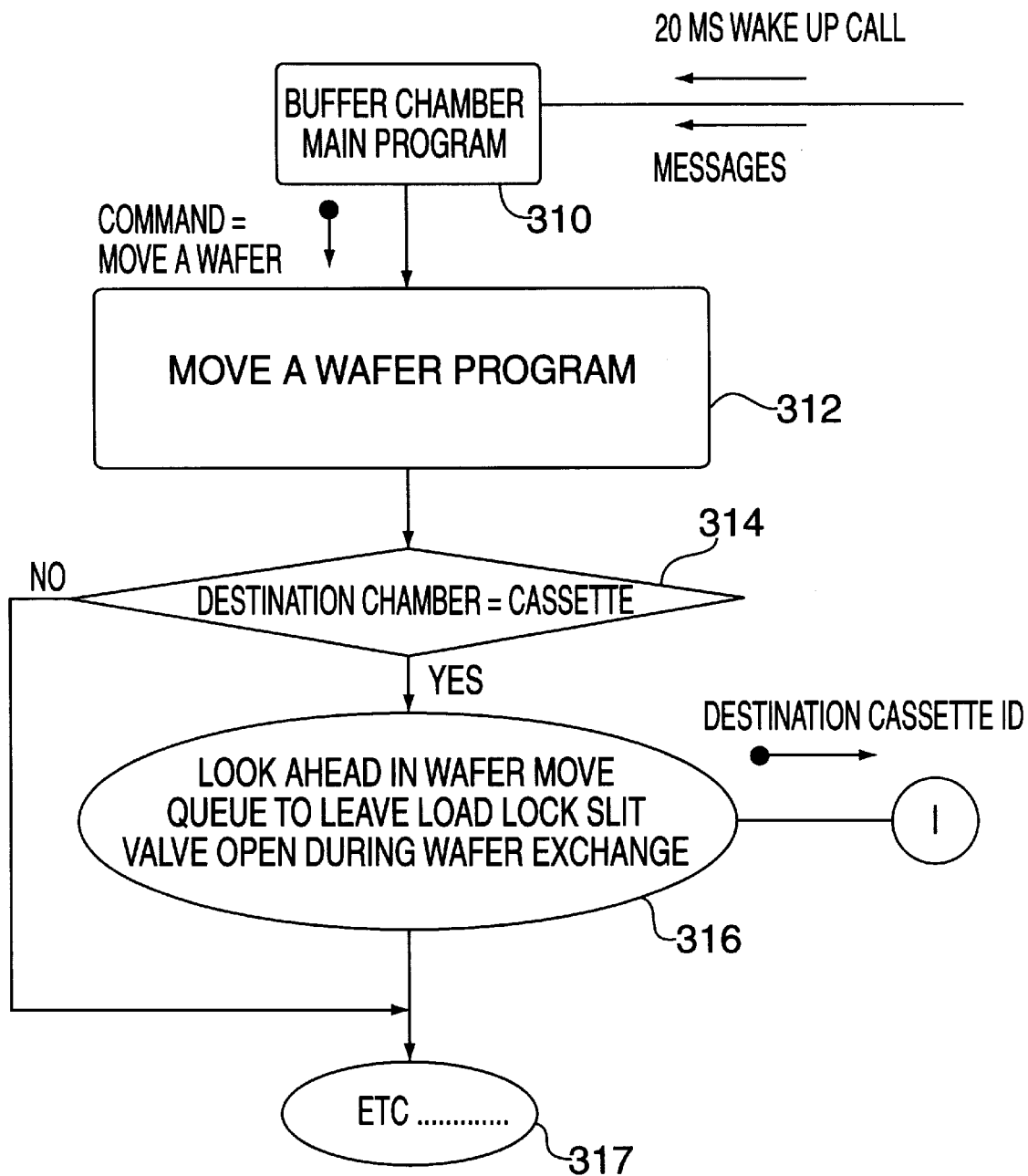
FIGS. 9a–9b are a detailed flow diagram of the buffer chamber task module of the process control program illustrated in FIG. 2.
Figure 9B:
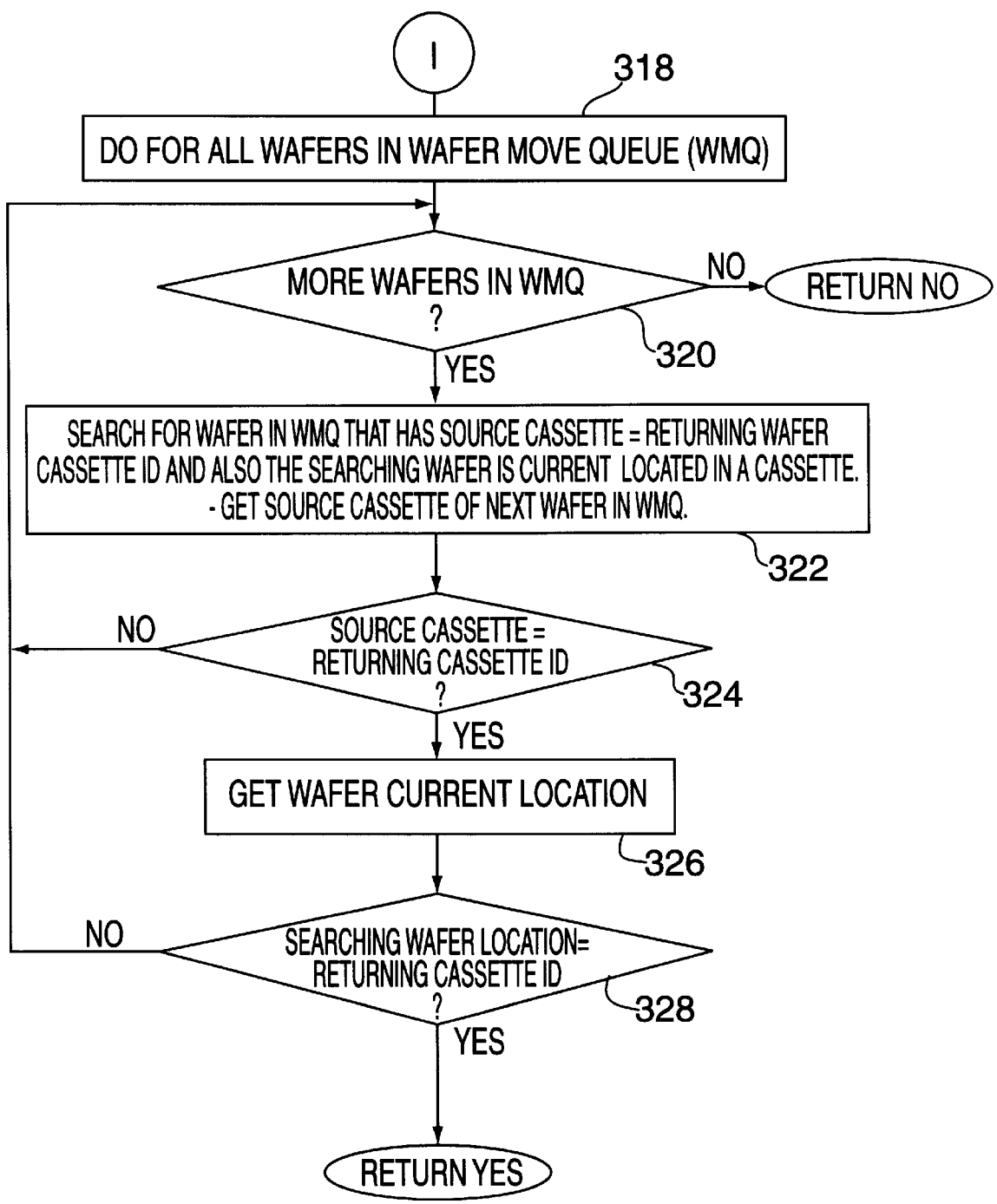

The buffer chamber task module 208 more fully detailed in the functional flow diagrams of FIGS. 9*a*–9*b* is the program which controls the wafer transfer mechanism 80 to perform the transfer of a wafer between the process chambers and the load locks. The buffer chamber task module 208 is called on an interrupt basis every 20 ms to perform this operation along with its other tasks related to the buffer chamber. If the buffer chamber task module 208 determines in block 310 that it has a command to move a particular wafer, it will call a wafer move program 312 to accomplish that task. The wafer move program 312 as described previously will control the transfer mechanism 82 to pick the wafer up from its source chamber and move it to its destination chamber. The program also controls the opening and closing of the entrance slit valves of the chambers to allow the transfers as necessary and to provide isolation during processing and cleaning. In accordance with another feature of the presequencer, the program, after it receives a wafer move command, also tests whether the destination is a slot in a cassette. If this test is true, then presequencer will look ahead in the wafer move queue to determine if there are other wafers bound for the load lock and will leave the load lock slit valve open after the wafer exchange in block 316. As such, multiple wafer exchanges can be accomplished without opening and closing the load lock slit valve for each exchange. Thereafter, the routine progresses to block 317 where it finishes its other tasks before returning to its interrupt exit point.

The detailed flow diagram of the routine in FIG. 9*b* implements the step 316 of FIG. 9*a*. Initially, the program determines whether there are more wafers in the wafer move queue in block 320, and if not, returns with a negative indication to the move a wafer program 312. If there are, the next wafer is tested in blocks 322, 324 to see if its source cassette identification is equivalent to the returning wafer cassette identification. If the test is affirmatively answered, the routine continues in block 326 where the current location of the next wafer is determined. After the current location of the wafer is determined, the program tests if that location is equivalent to the returning cassette identification in block 328. If yes, the program returns an affirmative response to the move a wafer program. Otherwise, the program transfers back to block 320 where the wafer move queue is tested to see if there are more wafers. This produces a flag to the move a wafer program that there is a wafer on the wafer move list located in the load lock that is scheduled for movement out of the load lock and while the present wafer is scheduled for movement into the load lock. The slit valve door must be opened to move the incoming wafer into the load lock and thereafter is intentionally left open so that the move a wafer program does not have to close the door just to reopen it later to transfer the outgoing wafer. Because there is considerable wafer transfer traffic at the load lock, particularly with presequencing, this elegant time saver increases efficiency and reduces wear and tear on the load lock mechanisms.

While the invention has been described in connection with a preferred embodiment, this specification is not intended to limit the scope of the invention to the particular forms set forth, but, on the contrary, it is intended to cover any such alternatives, modifications, and equivalents as may be included within the spirit and scope of the invention as defined by the appended claims.

What is claimed is:

1. A semiconductor wafer processing system comprising:
   a plurality of process chambers;
   a transfer chamber, centrally located among said plurality of process chambers, containing a transfer mechanism that transports wafers between the process chambers;
   a sequence task controller for controlling the wafer transfer mechanism, wherein the sequence task controller includes a presequencer that continuously looks ahead at a data structure stored in a computer memory to schedule and prioritize wafer movement among the process chambers.

2. The system of claim 1 wherein the plurality of process chambers include a source process chamber, a destination process chamber and a holding chamber and wherein said sequence task controller further comprises:
   means for identifying a deadlocked wafer in the source process chamber; and
   means for commanding the wafer transfer mechanism to transfer said identified deadlocked wafer to the holding chamber thereby releasing the source process chamber.

3. The system of claim 2 wherein said means for identifying a deadlocked wafer further comprises:
   means for determining a destination process chamber of a wafer and whether that resource will be available when a transfer from the source process chamber to the intended destination process chamber is scheduled; and
   means for identifying the wafer as a deadlocked wafer whenever the destination process chamber will be unavailable.

4. The system of claim 3 wherein said means for identifying a deadlocked wafer further comprises:
   means for reordering the wafer processing sequence to schedule a transfer of said deadlocked wafer from the holding chamber to its intended destination process chamber when that resource becomes available.

5. The system of claim 4 wherein the plurality of process chambers includes a load lock chamber and wherein said holding chamber is the load lock chamber.

6. The system of claim 1 wherein said deadlocked wafer is a mid-sequence wafer.

7. The system of claim 1 further including a orientor chamber wherein:
   said deadlocked wafer is an oriented wafer.

8. The system of claim 1 wherein the data structure comprises a wafer move queue, a chamber data structure, a wafer management data structure, and a wafer order list.

9. The system of claim 8 wherein said wafer order list contains information that uniquely identifies each wafer in said plurality of wafers using wafer identification data.

10. The system of claim 8 wherein said wafer move queue contains information that identifies a source process chamber and a destination process chamber for each of said wafers in said plurality of wafers.

11. The system of claim 8 wherein said chamber data structure contains information regarding chamber processing parameters.

12. The system of claim 8 wherein said wafer management data structure contains information that identifies the source process chamber of each wafer, the status of each wafer, a source cassette identification, and a source slot identification.

13. A method for processing wafers in a multiple chamber wafer processing system comprising the steps of:
    identifying a deadlocked wafer using a presequencer, wherein the presequencer continuously looks ahead at a data structure stored in a computer memory to schedule and prioritize wafer movement between a plurality of process chambers;
    moving said deadlocked wafer to a holding chamber until a destination chamber for the deadlocked wafer is available; and
    moving said deadlocked wafer to said destination chamber.

14. The method of claim 13 wherein said deadlocked wafer is within an orientor chamber.

15. The method of claim 13 wherein said identifying step further comprises the step of:
    reviewing a wafer move queue to identify a destination chamber for a particular wafer;
    reviewing a chamber data structure to determine if said destination chamber is available; and
    if the destination chamber is not available, identify the particular wafer as deadlocked.

16. The method of claim 15 further comprising the steps of:
    determining when said destination chamber will be available; and
    updating the wafer move queue with the particular wafer identification data to facilitate rescheduling of the particular wafer for moving to the destination chamber.

17. The method of claim 16 further comprising the step of:
    prioritizing any wafers in said wafer move queue after said wafer move queue is updated.

18. The method of claim 13 wherein said deadlocked wafer has a source chamber as the orientor chamber and said method further comprises the steps of maintaining an open orientor chamber door while a plurality of wafers are sequentially transferred from a load lock to the orientor chamber, oriented, and returned to the load lock until a destination chamber is available.

19. The method of claim 18 further comprising the step of moving an oriented wafer directly from said load lock to said destination chamber.

20. A method for the multiple chamber processing of wafers, where each wafer is sequentially processed in multiple process chambers adapted for one or more integrated circuit processes according to a process recipe and multiple wafers are scheduled, comprising the steps of:
    assembling a wafer order list identifying the timing and order in which the plurality of wafers are to be processed through the multiple process chambers and the different processes;
    processing said wafers according to said wafer order list;
    determining for each wafer identified on the wafer order list, from its present status in a source process chamber and its process recipe, the next destination process chamber in its process sequence and the status of the destination process chamber at the time of completion of the present process step;
    transferring the wafer to the destination process chamber if its status is available;

transferring the wafer to a holding chamber if the destination process chamber status is unavailable; and modifying the wafer order list to reschedule the wafer processing sequence for those wafers transferred to the holding chamber, by continuously looking ahead at a data structure stored in a computer memory.

21. The method of claim 20 further comprising the steps of:

detecting whether any of the wafers in the wafer order list can be transferred and, if none of the wafers can be transferred;

opening both a load lock and a orientor chamber to a transfer chamber;

performing wafer orientation by transferring a wafer from said load lock to said orientor chamber, orienting said wafer in said orientor chamber, and transferring said oriented wafer to said load lock;

repeating said wafer orientation upon other wafers in said load lock until a destination chamber is deemed available;

closing said load lock and orientor chamber; and transferring a wafer to the destination chamber.

* * * * *